(12) United States Patent
Lee et al.

(10) Patent No.: US 12,103,024 B2
(45) Date of Patent: Oct. 1, 2024

(54) MASK FOR DEPOSITION

(71) Applicant: Samsung Display Co., LTD., Yongin-si (KR)

(72) Inventors: Duck Jung Lee, Hwaseong-si (KR); Ji-Hee Son, Hwaseong-si (KR); Sung Soon Im, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/878,480

(22) Filed: Aug. 1, 2022

(65) Prior Publication Data

US 2023/0036369 A1 Feb. 2, 2023

(30) Foreign Application Priority Data

Aug. 2, 2021 (KR) .......................... 10-2021-0101215

(51) Int. Cl.
*B05B 12/28* (2018.01)
*B05C 21/00* (2006.01)

(52) U.S. Cl.
CPC ............ *B05B 12/28* (2018.02); *B05C 21/005* (2013.01)

(58) Field of Classification Search
None
See application file for complete search history.

(56) References Cited

U.S. PATENT DOCUMENTS

| 5,943,109 | A * | 8/1999 | Kim | ....................... | G02F 1/1335 349/113 |
| 7,505,220 | B2 * | 3/2009 | Soeno | ..................... | B82Y 10/00 360/77.08 |
| 7,672,075 | B2 * | 3/2010 | Soeno | ..................... | B82Y 40/00 360/48 |
| 7,767,574 | B2 * | 8/2010 | Gomi | ....................... | H01L 24/14 438/686 |
| 8,143,533 | B2 * | 3/2012 | Kaneda | .................. | H05K 3/426 174/262 |
| 8,245,754 | B2 * | 8/2012 | Fujita | ................ | H01L 21/67092 156/764 |
| 8,361,831 | B2 * | 1/2013 | Yane | ...................... | H01G 9/204 257/E27.125 |

(Continued)

FOREIGN PATENT DOCUMENTS

| EP | 3848482 | 7/2021 |
| JP | 2015-129333 | 7/2015 |

(Continued)

OTHER PUBLICATIONS

Extended European Search Report for European Application No. 22188076.8, dated May 10, 2023.

*Primary Examiner* — Jethro M. Pence

(74) *Attorney, Agent, or Firm* — KILE PARK REED & HOUTTEMAN PLLC

(57) ABSTRACT

A deposition mask including a resin film including first holes, a non-resin layer disposed on the resin film and including second holes corresponding to the first holes, and a protective layer disposed on the non-resin layer and including third holes corresponding to the first holes, wherein the protective layer includes a first portion disposed on a top surface of the non-resin layer, and a second portion covering a side surface of the second holes of the non-resin layer.

20 Claims, 20 Drawing Sheets

(56) References Cited

U.S. PATENT DOCUMENTS

| | | | | |
|---|---|---|---|---|
| 8,646,405 B2* | 2/2014 | An | B05B 12/20 | |
| | | | 118/504 | |
| 8,686,427 B2* | 4/2014 | Kim | H01L 27/1248 | |
| | | | 438/34 | |
| 8,721,905 B2* | 5/2014 | Yu | B82Y 10/00 | |
| | | | 216/49 | |
| 8,881,677 B2* | 11/2014 | De | H01L 22/10 | |
| | | | 118/504 | |
| 8,913,216 B2* | 12/2014 | Choe | G02F 1/133504 | |
| | | | 362/558 | |
| 8,986,909 B2* | 3/2015 | Bae | B82Y 10/00 | |
| | | | 430/5 | |
| 9,108,216 B2* | 8/2015 | Hirobe | H10K 71/166 | |
| 9,203,028 B2* | 12/2015 | Takeda | C23F 1/14 | |
| 9,223,069 B2* | 12/2015 | Jang | G02B 5/3058 | |
| 9,292,146 B2* | 3/2016 | Gotoh | H03K 17/9622 | |
| 9,343,679 B2* | 5/2016 | Hirobe | C23C 14/24 | |
| 9,379,324 B2* | 6/2016 | Takeda | C23C 16/042 | |
| 9,459,478 B2* | 10/2016 | Ro | G02F 1/133512 | |
| 9,527,098 B2* | 12/2016 | Hirobe | B05C 21/005 | |
| 9,548,453 B2* | 1/2017 | Hirobe | C23C 14/24 | |
| 9,673,396 B2* | 6/2017 | Kwon | H10K 71/18 | |
| 9,704,824 B2* | 7/2017 | Lin | H01L 21/786 | |
| 9,748,156 B1* | 8/2017 | Yeh | H01L 23/16 | |
| 9,893,284 B2* | 2/2018 | Kwon | H10K 59/173 | |
| 9,977,522 B2* | 5/2018 | Cho | G06F 3/0443 | |
| 9,989,845 B2* | 6/2018 | Park | G03F 7/0002 | |
| 10,090,467 B2* | 10/2018 | Kawato | C23C 14/042 | |
| 10,128,383 B2* | 11/2018 | Choung | H01L 29/78669 | |
| 10,139,673 B2* | 11/2018 | Park | G02F 1/133536 | |
| 10,147,881 B2* | 12/2018 | Kwon | G03F 7/26 | |
| 10,160,000 B2* | 12/2018 | Hirobe | B32B 38/0008 | |
| 10,173,240 B2* | 1/2019 | Mizumura | B05B 12/20 | |
| 10,189,042 B2* | 1/2019 | Hirobe | C23C 14/042 | |
| 10,211,430 B2* | 2/2019 | Jeong | H10K 50/8428 | |
| 10,281,817 B2* | 5/2019 | Kim | G03F 7/038 | |
| 10,301,715 B2* | 5/2019 | Yoo | B23K 26/24 | |
| 10,317,723 B2* | 6/2019 | Nam | G02B 5/3058 | |
| 10,384,417 B2* | 8/2019 | Ochi | H10K 71/164 | |
| 10,391,511 B2* | 8/2019 | Hirobe | C23F 1/02 | |
| 10,396,283 B2* | 8/2019 | Takeda | H10K 71/166 | |
| 10,401,676 B2* | 9/2019 | Kim | G03F 7/0007 | |
| 10,439,138 B2* | 10/2019 | Kishimoto | B23K 26/08 | |
| 10,439,170 B2* | 10/2019 | Lin | C23C 14/042 | |
| 10,451,914 B2* | 10/2019 | Kim | G02F 1/133528 | |
| 10,507,475 B2* | 12/2019 | Reichert | B30B 15/062 | |
| 10,558,077 B2* | 2/2020 | Jang | G02F 1/133308 | |
| 10,566,535 B2* | 2/2020 | Kwon | G03F 7/2002 | |
| 10,573,815 B2* | 2/2020 | Takeda | H10K 71/166 | |
| 10,597,766 B2* | 3/2020 | Obata | B05C 21/005 | |
| 10,597,768 B2* | 3/2020 | Obata | C23C 14/042 | |
| 10,615,344 B2* | 4/2020 | Nishida | C23C 14/042 | |
| 10,651,386 B2* | 5/2020 | Takeda | H10K 71/166 | |
| 10,658,591 B2* | 5/2020 | Kishimoto | B23K 26/22 | |
| 10,663,790 B2* | 5/2020 | Park | G02F 1/133536 | |
| 10,707,276 B2* | 7/2020 | Kim | H10K 59/38 | |
| 10,711,338 B2* | 7/2020 | Kawato | C23C 14/042 | |
| 10,773,427 B2* | 9/2020 | Jang | G03F 7/0002 | |
| 10,777,528 B2* | 9/2020 | Lin | H01L 24/19 | |
| 10,840,449 B2* | 11/2020 | Nishida | H10K 71/166 | |
| 10,858,726 B2* | 12/2020 | Nishida | C23C 14/12 | |
| 10,873,029 B2* | 12/2020 | Takeda | H10K 71/166 | |
| 10,886,505 B2* | 1/2021 | Han | H10K 71/00 | |
| 10,894,267 B2* | 1/2021 | Hirobe | B32B 37/182 | |
| 10,895,008 B2* | 1/2021 | Sone | C23C 14/042 | |
| 10,903,426 B2* | 1/2021 | Fujito | B05C 21/005 | |
| 10,934,614 B2* | 3/2021 | Sakio | C23C 14/042 | |
| 10,935,837 B2* | 3/2021 | Jang | G02F 1/133308 | |
| 10,978,641 B2* | 4/2021 | Takeda | C23C 14/042 | |
| 10,982,316 B2* | 4/2021 | Obata | H10K 50/11 | |
| 10,982,317 B2* | 4/2021 | Obata | C23C 14/048 | |
| 11,036,101 B2* | 6/2021 | Park | G02F 1/136286 | |
| 11,041,237 B2* | 6/2021 | Takeda | B23K 26/40 | |
| 11,133,364 B2* | 9/2021 | Hyung | H01L 29/78669 | |
| 11,178,754 B2* | 11/2021 | Nam | H05K 3/285 | |
| 11,196,002 B2* | 12/2021 | Kawasaki | C23C 14/042 | |
| 11,233,199 B2* | 1/2022 | Nishida | B32B 3/14 | |
| 11,307,721 B2* | 4/2022 | Cho | H05K 3/10 | |
| 11,313,027 B2* | 4/2022 | Sakio | C23C 14/12 | |
| 11,319,624 B2* | 5/2022 | Nishida | H10K 50/00 | |
| 11,488,933 B2* | 11/2022 | Lin | H01L 21/78 | |
| 11,511,301 B2* | 11/2022 | Hirobe | B05B 12/20 | |
| 11,515,379 B2* | 11/2022 | Du | H10K 59/124 | |
| 11,638,388 B2* | 4/2023 | Dong | H10K 71/233 | |
| | | | 118/504 | |
| 11,644,931 B2* | 5/2023 | Cho | G06F 3/041 | |
| | | | 216/13 | |
| 11,653,554 B2* | 5/2023 | Im | H10K 71/166 | |
| | | | 438/22 | |
| 11,696,486 B2* | 7/2023 | Kwag | H10K 71/00 | |
| | | | 438/99 | |
| 11,700,761 B2* | 7/2023 | Han | H10K 71/00 | |
| 11,706,968 B2* | 7/2023 | Fujito | C23F 1/28 | |
| 2007/0108163 A1* | 5/2007 | Hattori | B82Y 10/00 | |
| | | | 216/85 | |
| 2011/0212270 A1* | 9/2011 | Uchida | G11B 5/855 | |
| | | | 427/129 | |
| 2013/0015444 A1* | 1/2013 | Hirai | C23C 14/044 | |
| | | | 257/40 | |
| 2015/0001576 A1* | 1/2015 | Iwata | H10K 50/8445 | |
| | | | 438/26 | |
| 2015/0224704 A1* | 8/2015 | Cho | H10K 71/621 | |
| | | | 264/293 | |
| 2015/0246416 A1 | 9/2015 | Mizumura | | |
| 2015/0251205 A1* | 9/2015 | Hirobe | B32B 37/182 | |
| | | | 118/504 | |
| 2016/0161653 A1* | 6/2016 | Kim | C23C 16/0227 | |
| | | | 359/485.05 | |
| 2016/0168691 A1* | 6/2016 | Takeda | B23K 26/082 | |
| | | | 118/504 | |
| 2016/0268511 A1* | 9/2016 | Takeda | G03F 7/32 | |
| 2016/0288373 A1* | 10/2016 | Kim | G03F 7/0002 | |
| 2017/0110662 A1* | 4/2017 | Hirobe | C23C 16/042 | |
| 2017/0186955 A1* | 6/2017 | Takeda | H10K 50/82 | |
| 2017/0250381 A1 | 8/2017 | Okawara | | |
| 2017/0311411 A1* | 10/2017 | Takizawa | H10K 50/00 | |
| 2017/0362698 A1* | 12/2017 | Kobayashi | C23C 16/44 | |
| 2018/0216220 A1* | 8/2018 | Lv | C23C 14/042 | |
| 2018/0277763 A1* | 9/2018 | Takeda | C23F 1/12 | |
| 2019/0019994 A1* | 1/2019 | Lin | C23C 14/042 | |
| 2019/0055640 A1 | 2/2019 | Sakio | | |
| 2019/0071762 A1* | 3/2019 | Kobayashi | C23C 14/042 | |
| 2019/0123280 A1* | 4/2019 | Takeda | H10K 71/00 | |
| 2019/0296240 A1* | 9/2019 | Hirobe | C23C 14/24 | |
| 2019/0316245 A1* | 10/2019 | Nakamura | H10K 71/164 | |
| 2019/0345596 A1* | 11/2019 | Kataoka | H05B 33/10 | |
| 2019/0363257 A1* | 11/2019 | Takeda | H10K 71/166 | |
| 2020/0073235 A1* | 3/2020 | Park | G02B 5/3058 | |
| 2020/0165714 A1 | 5/2020 | Nishida et al. | | |
| 2020/0181755 A1* | 6/2020 | Kobayashi | C23C 14/042 | |
| 2020/0395545 A1* | 12/2020 | Hirobe | C23C 16/042 | |
| 2021/0066601 A1* | 3/2021 | Takeda | H10K 71/166 | |
| 2021/0098702 A1* | 4/2021 | Takeda | H10K 71/00 | |
| 2021/0167290 A1* | 6/2021 | Takeda | H10K 71/166 | |
| 2021/0193743 A1* | 6/2021 | Kim | G06F 1/1652 | |
| 2021/0195757 A1* | 6/2021 | Minatoya | H05K 3/0097 | |
| 2021/0207258 A1* | 7/2021 | Obata | B05C 21/005 | |
| 2021/0214843 A1* | 7/2021 | Sone | H10K 71/00 | |
| 2021/0217997 A1 | 7/2021 | Kwag et al. | | |
| 2021/0222283 A1* | 7/2021 | Obata | H10K 50/11 | |
| 2021/0265602 A1* | 8/2021 | Sakio | C23C 14/042 | |
| 2021/0269913 A1* | 9/2021 | Takeda | C23C 14/042 | |
| 2022/0035204 A1* | 2/2022 | He | G02F 1/133603 | |
| 2022/0049343 A1* | 2/2022 | Lee | C23C 14/50 | |
| 2022/0088715 A1* | 3/2022 | Sakio | B23K 26/36 | |
| 2022/0220600 A1* | 7/2022 | Nishida | C23C 14/50 | |
| 2022/0352241 A1* | 11/2022 | Jeon | H01L 25/0753 | |
| 2022/0384555 A1* | 12/2022 | Ma | H10K 59/1213 | |
| 2023/0012958 A1* | 1/2023 | Lin | H01L 21/561 | |

(56) References Cited

U.S. PATENT DOCUMENTS

| | | | |
|---|---|---|---|
| 2023/0021609 A1* | 1/2023 | Du | H10K 59/1213 |
| 2023/0042852 A1* | 2/2023 | Kim | H01L 25/0652 |
| 2023/0140362 A1* | 5/2023 | Byun | H10K 59/123 |
| | | | 257/296 |

FOREIGN PATENT DOCUMENTS

| | | |
|---|---|---|
| JP | 2015-148002 | 8/2015 |
| JP | 6142388 | 6/2017 |
| KR | 10-2018-0016268 | 2/2018 |
| KR | 10-2089835 | 3/2020 |
| KR | 10-2207286 | 1/2021 |
| KR | 10-2021-0091382 | 7/2021 |

* cited by examiner

MASK FOR DEPOSITION

CROSS-REFERENCE TO RELATED APPLICATION(S)

This application claims priority to and the benefits of Korean Patent Application No. 10-2021-0101215 under 35 USC § 119, filed in the Korean Intellectual Property Office (KIPO) on Aug. 2, 2021, the entire content of which is incorporated herein by reference.

BACKGROUND

1. Technical Field

The disclosure relates to a deposition mask.

2. Description of the Related Art

An electronic device such as a display device includes a plurality of stacked layers, and at least a layer is formed using a deposition method.

A pattern layer formed by deposition may be formed by using a deposition mask having an opening pattern formed thereon. The deposition mask includes a fine metal mask made of a metal or an alloy having a low thermal expansion coefficient, such as Invar. Electronic devices such as display devices have recently been becoming larger and higher in resolution, but in the case of the fine metal mask, it is heavy, it is not easy to enlarge an area thereof, and resolution of an opening pattern of the mask is not precise, and thus a deposition mask including a resin film that is capable of being lighter, being easily thinned, and having a large area is being developed as compared with the fine metal mask.

The above information disclosed in this background section is only for enhancement of understanding of the background of the disclosure, and therefore, it may contain information that does not form the prior art that may already be known to a person of ordinary skill in the art.

SUMMARY

Embodiments of the disclosure provide a deposition mask including a resin film and a non-resin layer to be fixed to a substrate to be deposited is positioned on the resin film.

The deposition mask capable of minimizing damage such as peeling to a non-resin layer formed on a resin film during a deposition process.

According to one or more embodiments, a deposition mask may include a resin film including first holes, a non-resin layer disposed on the resin film and including second holes corresponding to the first holes, and a protective layer disposed on the non-resin layer and including third holes corresponding to the first holes, wherein the protective layer includes a first portion disposed on a top surface of the non-resin layer, and a second portion covering a side surface of the second holes of the non-resin layer.

The protective layer may include at least one of a fluorine-based organic material, a fluorine-based inorganic material, and a fluorine-based metal material.

The non-resin layer may include at least one of a magnetic material or a conductive material.

The resin film may include a polyimide (PI).

The third holes of the protective layer may be defined by an outer side surface of the second portion of the protection layer.

The second portion of the protective layer may cover a side surface of the first holes of the resin film.

The resin film may include a recess portion located in an upper portion of the resin film.

The non-resin layer may include a fourth hole corresponding to the recess portion.

The protective layer may cover a side surface of the recess portion and a side surface of the fourth hole of the non-resin layer.

It may further include an interlayer disposed on the resin film.

The interlayer may include a portion disposed between the resin film or the non-resin layer and between the non-resin layer and the protective layer.

The interlayer may include a portion covering a side surface of the first holes of the resin film.

The interlayer may include an inorganic material.

According to one or more embodiments, a deposition mask may include a resin film including first holes, a non-resin layer disposed on the resin film and including second holes corresponding to the first holes, and a protective layer disposed on the non-resin layer and including third holes corresponding to the first holes, wherein the protective layer and the resin film surround a portion of the non-resin layer disposed between adjacent second holes such that the portion of the non-resin layer between the adjacent second holes is sealed.

The protective layer may include at least one of a fluorine-based organic material, a fluorine-based inorganic material, and a fluorine-based metal material.

The non-resin layer may include at least one of a magnetic material, or a conductive material.

The resin film may include a recess portion located in an upper portion of the resin film.

According to one or more embodiments, a deposition mask may include a resin film including first holes, a non-resin layer disposed on the resin film including second holes corresponding to the first holes, and a protective layer disposed on the non-resin layer and including third holes corresponding to the first holes, wherein the resin film includes a recess portion located in an upper portion of the resin film. The protective layer covers a side surface of the recess portion.

The non-resin layer may include a fourth hole corresponding to the recess portion.

The protective layer may cover a side surface of the fourth hole of the non-resin layer.

The non-resin layer may include at least one of a magnetic material and a conductive material.

According to the embodiments of the disclosure, it may be possible to provide a deposition mask capable of minimizing damage such as peeling to a non-resin layer formed on a resin film during a deposition process.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
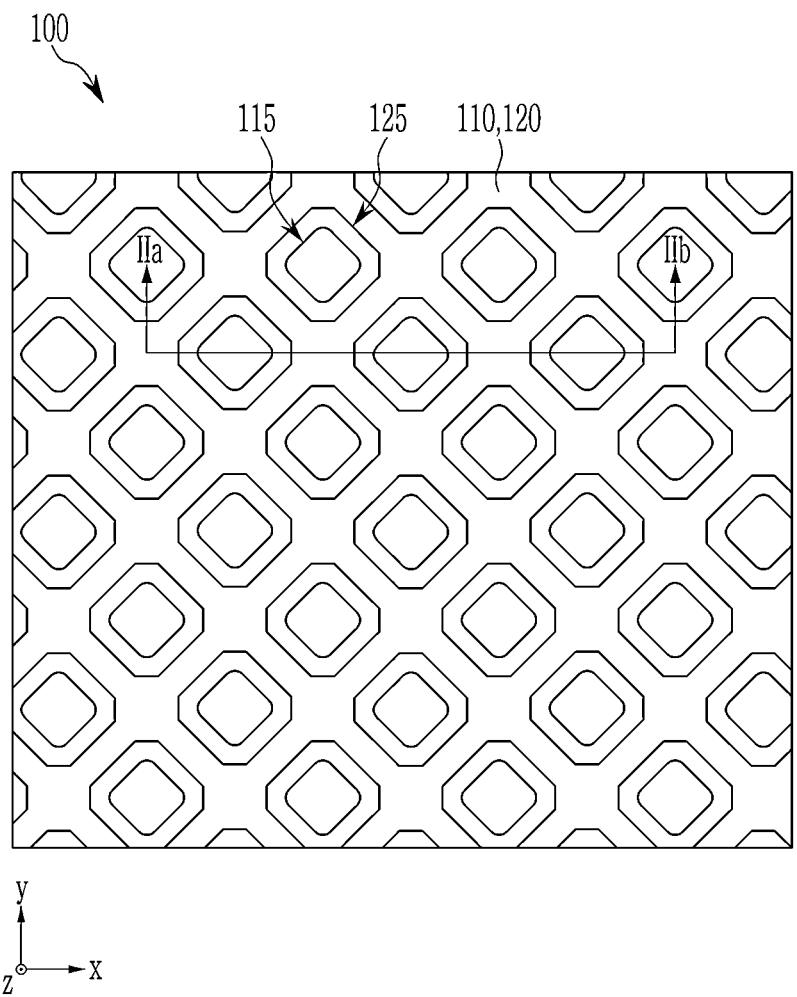
FIG. 1 illustrates a schematic top plan view of a deposition mask according to an embodiment.

Hereinafter, embodiments will be described more fully hereinafter with reference to the accompanying drawings, wherein like reference numerals refer to like elements throughout. As those skilled in the art would realize, the described embodiments may be modified in various different ways, all without departing from the spirit or scope of the disclosure.

To clearly describes the embodiments, parts that are irrelevant to the description are omitted, and like numerals refer to like or similar constituent elements throughout the specification.

Reference will now be made in detail to embodiments, examples of which are illustrated in the accompanying drawings, and in the drawings, the same elements are denoted by the same reference numerals, and thus a repeated description thereof will be omitted.

Further, since sizes and thicknesses of constituent members shown in the accompanying drawings are arbitrarily given for better understanding and ease of description, the embodiments are not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

Accordingly, the embodiments are merely described below, by referring to the figures, to explain aspects of the disclosure. As used herein, the term "and/or" includes any and all combinations of one or more of the associated listed items. Throughout the disclosure, the expression "at least one of a, b, or c" or "at least one of a, b, or c" indicates only a, only b, only c, both a and b, both a and c, both b and c, all of a, b, and c, or variations thereof.

As the disclosure allows for various changes and numerous embodiments will be illustrated in the drawings and described in the detailed description. Effects and features of the disclosure, and methods for achieving the same will be apparent with reference to embodiments described below in detail with the accompanying drawings. However, the disclosure is not limited to the following embodiments disclosed below and may be implemented in various forms.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween.

In addition, unless explicitly described to the contrary, the word "comprise" and variations such as "comprises" or "comprising" will be understood to imply the inclusion of stated elements but not the exclusion of any other elements.

In the specification, the phrase "in a plan view" means when an object portion is viewed from above, and the phrase "in a cross-sectional view" means when a cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first object may directly or indirectly oppose a second object. In a case in which a third object intervenes between the first and second object, the first and second objects may be understood as being indirectly opposed to one another, although still facing each other.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In addition, in the specification, "connected" means that two or more components are not only directly connected, but two or more components may be connected indirectly through other components, physically connected as well as being electrically connected, or it may be referred to be different names depending on the location or function, but may include connecting each of parts that are substantially integral to each other.

Although the terms "first," "second," and the like may be used to describe various elements, these elements should not be limited by these terms. These terms are only used to distinguish one element from another.

As used herein, the singular forms "a," "an," and "the" are intended to include the plural forms as well, unless the context clearly indicates otherwise.

When an embodiment may be implemented differently, a specific process order may be different from the described order. For example, two consecutively described processes may be performed substantially at the same time or may be performed in an order opposite to the described order.

Figure 2:
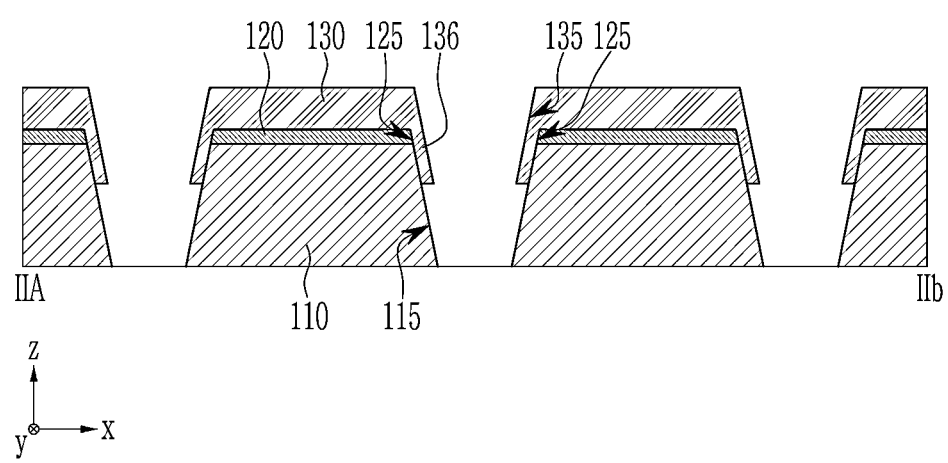
FIG. 2 illustrates a schematic cross-sectional view illustrating the deposition mask taken along line IIa-IIb in FIG. 1.

FIG. 1 illustrates a schematic top plan view of a deposition mask according to an embodiment, and FIG. 2 illustrates a schematic cross-sectional view illustrating the deposition mask taken along line IIa-IIb of FIG. 1.

A deposition mask 100 according to an embodiment may include a resin film 110, a non-resin layer 120, and a protective layer 130.

The resin film 110 may be a film extending on an XY plane, and may form a main body of the deposition mask 100. The resin film 110 may include a resin having a low thermal expansion coefficient, e.g., a polyimide (PI) film and the like.

The resin film 110 may include holes 115 penetrating the resin film 110 in a Z direction that is perpendicular to the XY plane. The holes 115 may be referred as an opening pattern, and may have a shape corresponding to a pattern of a pattern layer to be deposited using the deposition mask 100.

The non-resin layer 120 may be positioned or disposed on the resin film 110 overlapping a top surface of the resin film 110.

The non-resin layer 120 may be in contact with the top surface of the resin film 110.

The non-resin layer 120 may include a conductive material or a magnetic material such that the non-resin layer 120 may be closely or tightly fixed to a substrate to be deposited in a deposition process.

For example, the non-resin layer 120 may include a magnetic material that may fix the deposition mask 100 to the substrate by positioning a magnet on a first surface of the substrate and a second surface opposite thereto. The magnetic material may include iron (Fe), nickel (Ni), cobalt (Co), or an alloy of at least two thereof.

For example, the non-resin layer 120 may include a conductive material such as a metal that may adsorb and fix the deposition mask 100 to the substrate by positioning an electrostatic chuck at a side of the substrate that faces the deposition mask 100. The conductive material may include, titanium (Ti), molybdenum (Mo), ITO, IZO, and the like.

The non-resin layer 120 may be supported by the resin film 110.

The non-resin layer 120 may include holes 125 penetrating the non-resin layer 120 in the Z direction. The holes 125 may have a shape corresponding to the holes 115 of the resin film 110. The holes 125 may include a side surface aligning with an upper side surface of the holes 115 of the resin film 110.

The holes 115 of the resin film 110 may be tapered as illustrated in FIG. 1. A boundary of the holes 125 of the non-resin layer 120 or a boundary of an uppermost portion of the resin film 110 may be positioned outside a boundary of a lowermost portion of the holes 115 of the resin film 110 on the XY plane.

The holes 115 and 125 may selectively pass a deposition material through during the deposition process such that the pattern layer that includes a pattern of a predetermined shape may be formed on the substrate. The pattern layer may include a light emitting layer for a light emitting diode of a display device.

The protective layer 130 may be positioned or disposed on the non-resin layer 120.

The protective layer 130 may protect the non-resin layer 120. For example, the protective layer 130 may cover and protect a top surface and a side surface of the non-resin layer 120.

For example, the protective layer 130 may include an upper portion (indicated by 130) positioned or disposed on the top surface of the non-resin layer 120 and overlapping the top surface of the non-resin layer 120, and a lateral portion 136 covering and overlapping the side surface of the non-resin layer 120 that defines the holes 125 of the non-resin layer 120. The lateral portion 136 of the protective layer 130 may continuously extend to the upper portion of the protective layer 130.

The lateral portion 136 of the protective layer 130 may cover a side surface of the resin film 110 that defines the holes 115.

A lower end of the lateral portion 136 of the protective layer 130 may be positioned lower than the top surface of the non-resin layer 120 such that the lower end of the lateral position 136 may be closer to a bottom surface of the resin film 110.

The protective layer 130 and the resin film 110 may surround or enclose a portion of the non-resin layer 120 positioned or disposed between adjacent holes 125 such that the portion of the non-resin layer 120 may be sealed off.

The protective layer 130 may include holes 135 penetrating the protective layer 130 in the Z direction. The holes 135 may have a shape corresponding to the holes 115 of the resin film 110. The holes 135 may include a side surface that parallels to the side surface of the holes 115 of the resin film 110.

The holes 135 may be defined by an outer side surface of the lateral portion 136 of the protective layer 130.

The holes 115 of the resin film 110 may be tapered. The holes 135 of the protective layer 130 may be positioned inside the holes 125 of the non-resin layer 120 on the XY plane, and the holes 115 of the resin film 110 may be positioned inside the holes 125 of the non-resin layer 120 on the XY plane. As another embodiment, the holes 135 of the protective layer 130 may be positioned inside the holes 125 of the non-resin layer 120 on the XY plane, and the holes 115 of the resin film 110 may be positioned inside the holes 135 on the XY plane.

The protective layer 130 may be in contact with the top surface of the non-resin layer 120, and the lateral portion 136 of the protective layer 130 may be in contact with the side surface of the non-resin layer 120 that defines the holes 125 of the non-resin layer 120.

The protective layer 130 may be adhered to the non-resin layer 120, and may include a material that is not soluble as a cleaning agent that cleans excess deposition material in the deposition process.

The protective layer 130 may include a fluorine-based material, e.g., at least one of an organic material containing fluorine, an inorganic material containing fluorine, and a metal material such as molybdenum (Mo) containing fluorine.

The protective layer 130 including the fluorine-based organic material may be patterned by dissolving only in a fluorine-based organic solvent such as hydrofluoroether (HFE), and the like. An organic material containing the fluorine may include about 50 wt % or more.

Accordingly, the protective layer 130 may not melt when performing deposition on the substrate using the deposition mask 100 according to an embodiment and when cleaning the remaining deposition material. Accordingly, in the cleaning process, the protective layer 130 may protect the non-resin layer 120 such that the non-resin layer 120 may not be exposed to a cleaning solution or ultrasonic waves, thereby damage to the non-resin layer 120 such as peeling may be minimized.

A description of a deposition mask according to an embodiment follows below with reference to FIG. 3 and FIG. 4

Figure 3:
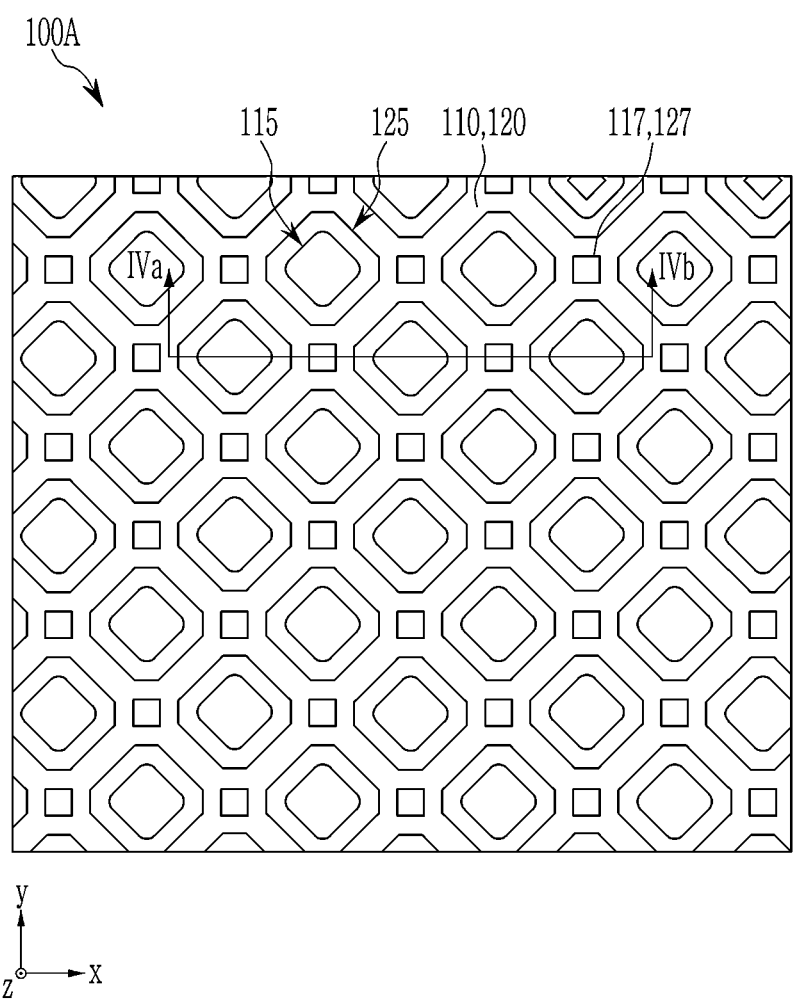
FIG. 3 illustrates a schematic top plan view of a deposition mask according to an embodiment.
Figure 4:
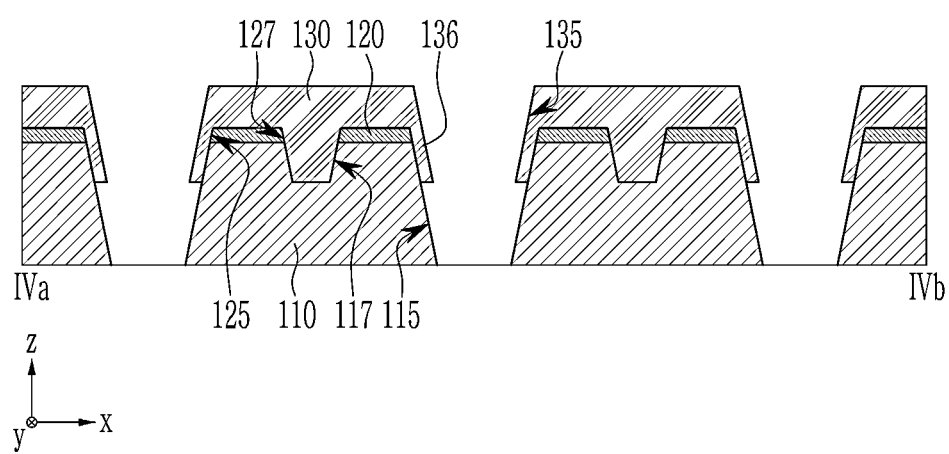
FIG. 4 illustrates a schematic cross-sectional view illustrating the deposition mask taken along line IVa-IVb in FIG. 3.

FIG. 3 illustrates a schematic top plan view of a deposition mask according to an embodiment, and FIG. 4 illustrates a schematic cross-sectional view illustrating the deposition mask taken along line IVa-IVb of FIG. 3. In FIGS. 3 and 4, the same components as those in FIGS. 1 and 2 are denoted by the same reference numerals, and thus a repeated description thereof will be omitted.

A deposition mask 100A according to an embodiment may be similar to the deposition mask 100 described above, a recess portion (trench) 117 located in the upper portion of the resin film 110 may be included. The recess portion 117 may be referred as a hole.

The recess portion 117 may have various shapes on the XY plane. For example, the recess portion 117 may have various polygonal shapes such as a quadrangle, a triangle, a circular shape, an oval shape, but the embodiment is not limited thereto.

A thickness of the resin film 110 in the recess portion 117 may be greater than zero.

The non-resin layer 120 may include a hole 127 corresponding to the shape of the recess portion 117 of the resin film 110. The hole 127 may penetrate the non-resin layer 120 in the Z direction, and may include a side surface aligning with a side surface of the recess portion 117 of the resin film 110.

The protective layer 130 may cover the side surface of the resin film 110 that defines the recess portion 117 and the side surface of the non-resin layer 120 that defines the hole 127. The protective layer 130 may contact the side surface of the resin film 110 that defines the recess portion 117 and the side surface of the non-resin layer 120 which defines the hole 127.

Accordingly, a contact area between the protective layer 130 and the resin film 110 may be increased such that contact between the protective layer 130 and the resin film 110 may be improved.

A description of an effect of the deposition using the deposition mask 100 according to an embodiment follows below with reference to FIG. 5 and FIG. 6.

Figure 5:
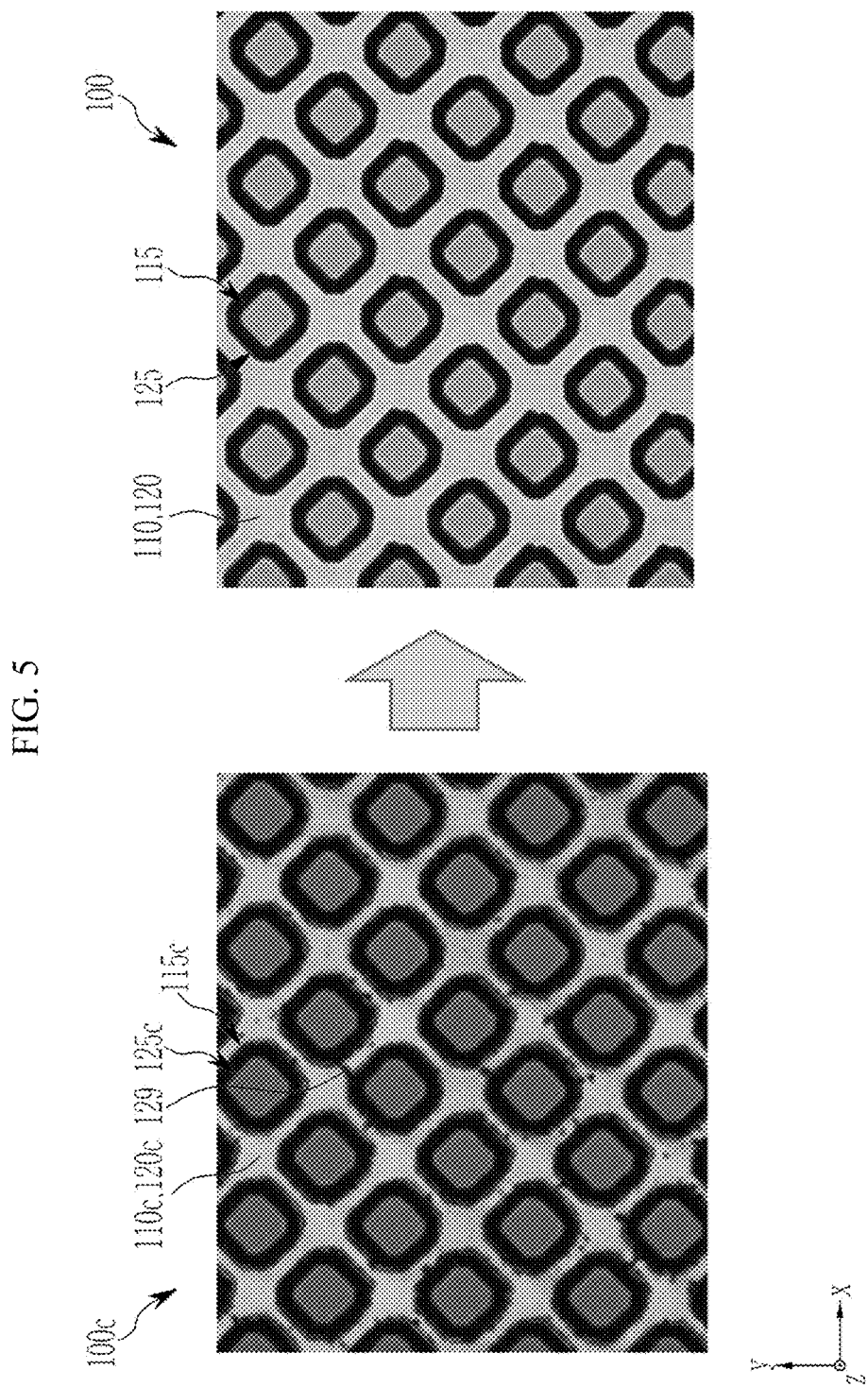
FIG. 5 illustrates a photograph showing a planar shape after a deposition process of a deposition mask according to a comparative example and a deposition mask according to an embodiment.

FIG. 5 illustrates a photograph showing a planar shape of a deposition mask 100c after the deposition process according to a comparative example and a planar shape of a deposition mask 100 after the deposition process according to an embodiment.

Referring to FIG. 5, the deposition mask 100c according to the comparative example includes a resin film 110c and a non-resin layer 120c respectively corresponding to the resin film 110 and the non-resin layer 120 of the deposition mask 100 according to the embodiment. The resin film 110c has a hole 115c, while the non-resin layer 120c has a hole 125c corresponding to the hole 115c. The deposition mask 100c according to the comparative example does not include the protective layer 130 as in the embodiment.

During a step of cleaning the remaining deposition material in which the deposition process using the deposition mask 100c according to the comparative example has been performed, a portion 129 may peeled off from the non-resin layer 120c by a cleaning solution, ultrasonic waves, or the like, and accordingly, the non-resin layer 120c may be damaged.

However, even after cleaning step in which the deposition process using the deposition mask 100 according to the embodiment has been performed, the non-resin layer 120 may be protected by the protective layer 130, and thus damage such as peeling of the non-resin layer 120 may not occur.

Also, even when the deposition process is performed using the deposition mask 100A according to the embodiment illustrated in FIG. 3 and FIG. 4, the non-resin layer 120 may be protected by the protective layer 130, and thus damage such as peeling of the non-resin layer 120 may not occur. Accordingly, a protective function of the protective layer 130 with respect to the non-resin layer 120 may be further improved by the recess portion 117 of the resin film 110.

Figure 6:
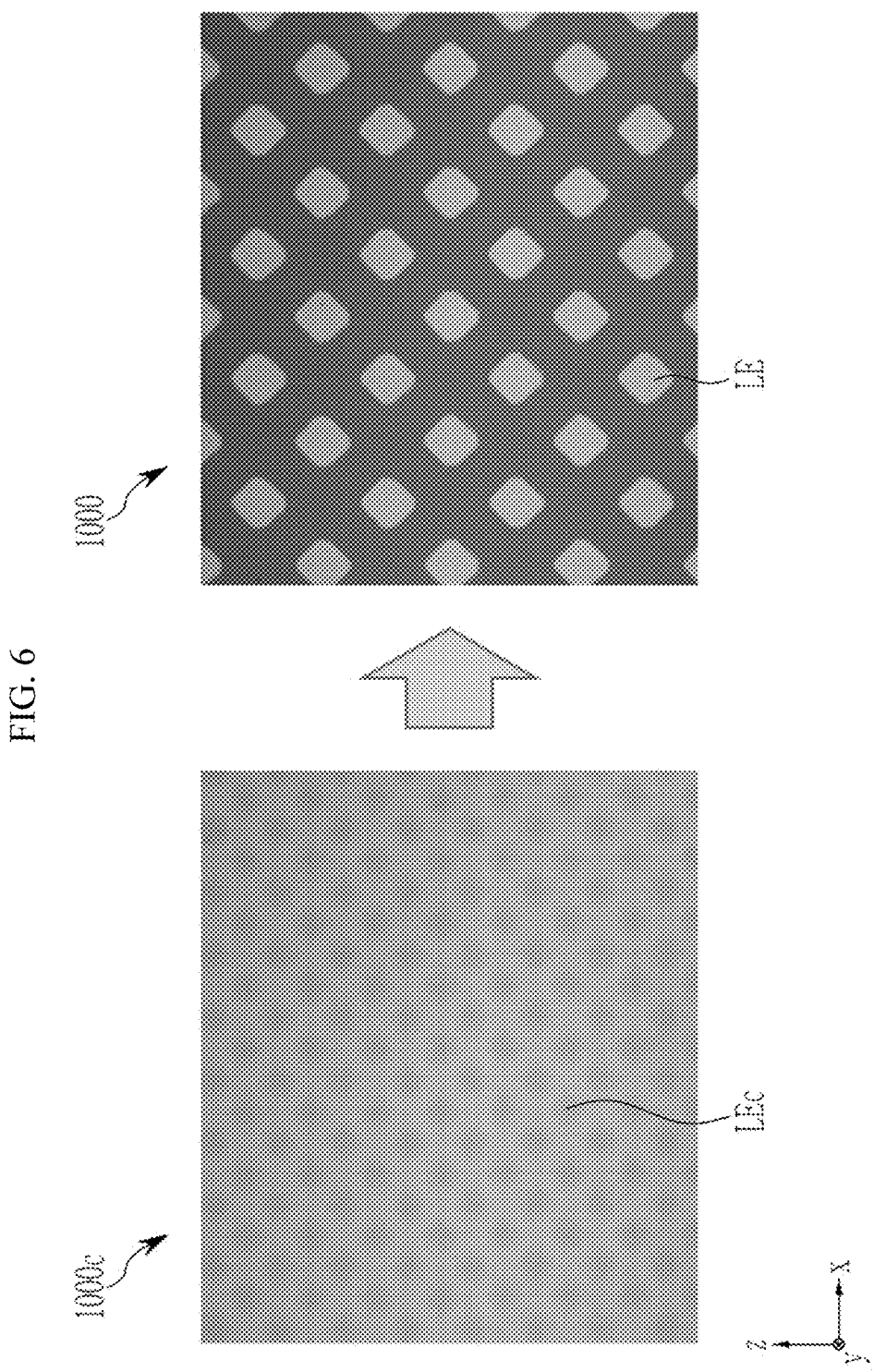
FIG. 6 illustrates a photograph showing a planar shape of a pattern layer deposited using a deposition mask according to a comparative example and a pattern layer deposited using a deposition mask according to an embodiment.

FIG. 6 illustrates a photograph showing a planar shape of a pattern layer 1000c deposited using the deposition mask 100c according to the comparative example of FIG. 5 and a pattern layer 1000 deposited using the deposition mask according to an embodiment.

The pattern layer 1000c or 1000 illustrated in FIG. 6 may be an emission layer LEc or LE of an emissive display device, but the disclosure is not limited thereto.

When the deposition mask 100c according to the comparative example is used, portion of the non-resin layer 120c may be peeled off during the cleaning process as described above and the deposition mask 100c may be damaged. When an additional deposition process is performed using the damaged deposition mask 100c as described above, the deposition mask 100c is not closely or tightly fixed to the substrate to be deposited due to the damaged (e.g., de-filmed) non-resin layer 120c. Accordingly, as in the pattern layer 1000c according to the comparative example illustrated in FIG. 6, precision of the pattern is deteriorated, and a shadow phenomenon occurs.

However, since the deposition process is performed using the deposition mask 100 according to the embodiment, damage to the non-resin layer 120 may be prevented, accordingly, the deposition mask 100 may be closely or tightly fixed to the substrate to be deposited by the non-resin layer 120. Accordingly, the precision of the pattern may be maintained as in the pattern layer 1000 according to the embodiment illustrated in FIG. 6.

Also, since the deposition process is performed using the deposition mask 100A according to the embodiment of FIG. 3 and FIG. 4, damage to the non-resin layer 120 may be prevented, accordingly, the deposition mask 100A may be closely or tightly fixed to the substrate to be deposited by the non-resin layer 120. Accordingly, the precision of the pattern may be maintained as in the pattern layer 1000 according to the embodiment illustrated in FIG. 6. A protective function of the protective layer 130 with respect to the non-resin layer 120 may be further improved by the recess portion 117 of the resin film 110 as the pattern layer 1000 according to the embodiment may have a more precise and reliable pattern.

A description of a manufacturing method of a deposition mask according to an embodiment follows below with reference to FIGS. 7 to 12 together with the previously described drawings.

FIGS. 7 to 12 illustrate schematic cross-sectional views of a manufacturing method of a deposition mask according to an embodiment.

Figure 7:
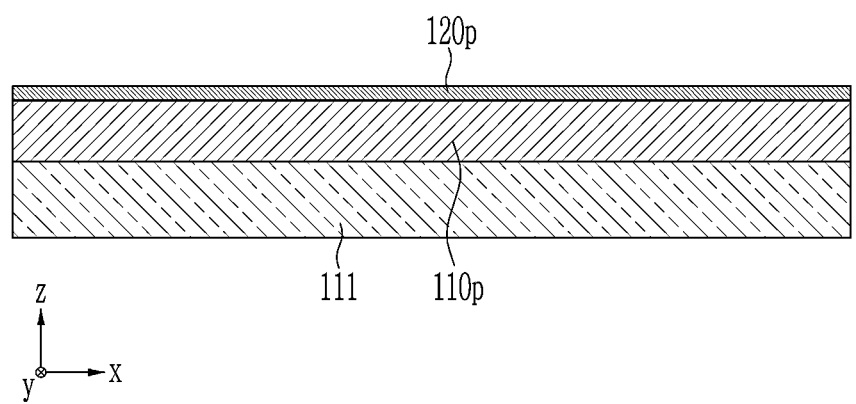
FIGS. 7 to 12 illustrate schematic cross-sectional views of a manufacturing method of a deposition mask according to an embodiment, and FIGS. 13 to 20 each illustrate schematic cross-sectional views of a deposition mask according to an embodiment.

Referring to FIG. 7, a resin film 110p is formed by disposing or coating a resin such as polyimide and the like on a carrier substrate 111 such as glass and the like.

A non-resin layer 120p may be disposed on the resin film 110p by depositing at least one of a magnetic material such as iron (Fe), nickel (Ni), and cobalt (Co), or other suitable materials, or a conductive material such as titanium (Ti), molybdenum (Mo), ITO, and IZO, or other suitable materials.

Figure 8:
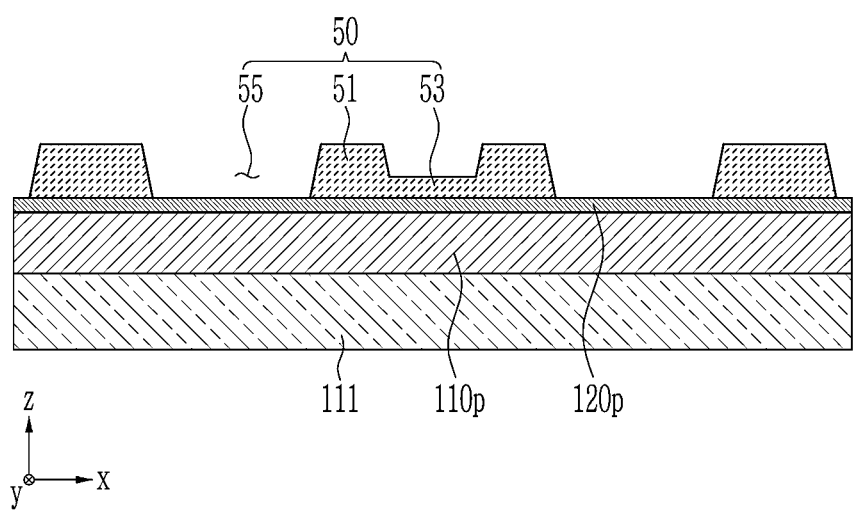

Referring to FIG. 8, a photoresist pattern 50 may be formed by disposing or stacking a photoresist on the non-resin layer 120p and a photolithography process may be performed.

In the embodiment illustrated in FIG. 1 and FIG. 2 described above, the photoresist pattern 50 may include portions 51 and 53 in which a portion of the photoresist may be remained and an opening 55 in which another portion of the photoresist may be removed.

However, in the embodiment illustrated in FIG. 3 and FIG. 4 described above, the photoresist pattern 50 may have a thick portion 51, a thin portion 53 that is thinner than the thick portion 51, and the opening 55 from which the photoresist may be removed. The photoresist layer may be exposed by using a photomask including a light-transmitting portion through which light may be transmitted, a light-blocking portion through which light may be blocked, and a halftone portion through which light may be partially transmitted.

Figure 9:
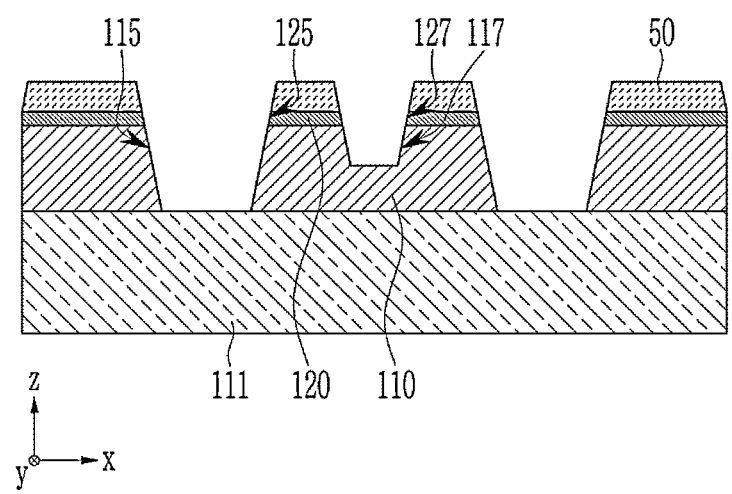

Referring to FIG. 9, the non-resin layer 120p and the resin film 110p may be etched using the photoresist pattern 50 as a mask to form the holes 115 and 125.

Figure 10:
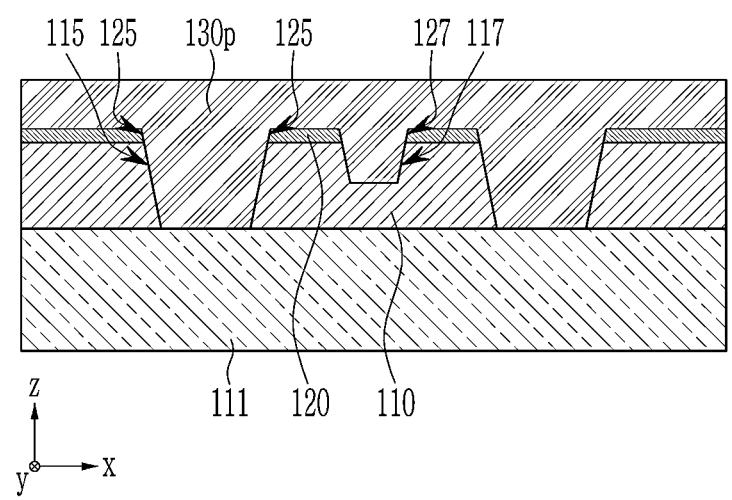

FIG. 10 illustrate a manufacturing step of the deposition mask according to the embodiment of FIG. 1 and FIG. 2 described above. However, in the embodiment illustrated in FIGS. 3 and 4 described above, the hole 127 in the non-resin layer 120 and the corresponding recess portion 117 in the resin film 110 may be formed by removing the thin portion 53 of the photoresist pattern 50 and etching the non-resin layer 120p and the resin film 110p that exposed by the remaining photoresist pattern 50.

Then, the photoresist pattern 50 may be removed.

Referring to FIG. 10, a protective layer 130p may be formed by disposing or stacking a fluorine-based material on the non-resin layer 120 by a method such as coating or vacuum deposition. In the embodiment, an example of the protective layer 130p including a photosensitive fluorine-based organic material will be described.

Figure 11:
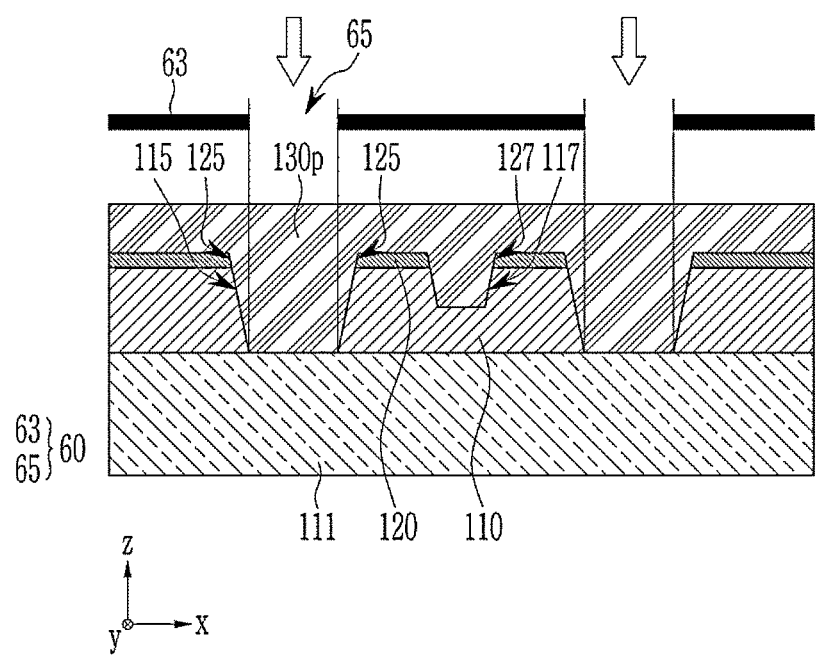

Referring to FIG. 11, the protective layer 130p may be exposed through a photomask 60. When the protective layer 130p including positive photosensitivity, the photomask 60 may include a light-blocking portion 63 and a light-transmitting portion 65 corresponding to the hole 115 of the resin film 110.

In the embodiment, on the XY plane, a side surface of the light-transmitting portion 65 of the photomask 60 may be spaced apart from the side surface of the hole 125 of the non-resin layer 120, and may not overlap the bottom surface of the hole 115 of the resin film 110. For example, the light-blocking portion 63 of the photomask 60 may overlap the side surface of the hole 125 of the non-resin layer 120, and may not overlap the bottom surface of the hole 115 of the resin film 110.

FIG. 11 illustrate that the protective layer 130p may include positive photosensitivity. However, in another embodiment, the protective layer 130p may include negative photosensitivity, the light-blocking portion 63 and the light-transmitting portion 65 of the photomask 60 may be variously changed according to the protective layer 130p.

Figure 12:
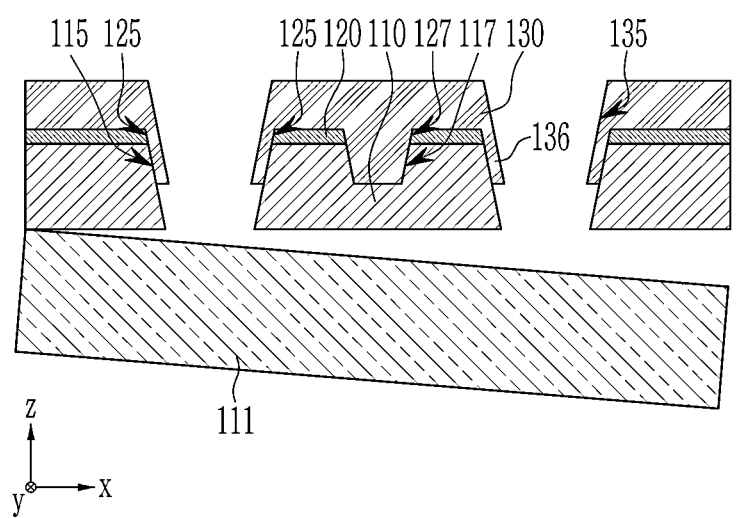

Referring to FIG. 12, the exposed protective layer 130p may be developed to complete the protective layer 130 which may include the lateral portion 136 and the hole 135.

After the protective layer 130 including the lateral portion 136 and the hole 136 may be formed, the carrier substrate 111 may be separated from the prepared deposition mask 1000.

The deposition mask 1000 that separated from the carrier substrate 111 may be attached to a mask frame (not shown) by welding or the like.

At least some steps of the manufacturing method of the deposition mask described above may not be limited thereto.

For example, when the protective layer 130 may be non-photosensitive, the protective layer 130 according to the embodiment may be formed by etching the protective layer 130p using the photoresist pattern 50 as a mask. For example, by etching the protective layer 130p using the photoresist pattern 50 as a mask after forming the photoresist pattern 50 on the protective layer 130p without direct exposure to the protective layer 130p.

A description of a deposition mask according to an embodiment follows below with reference to FIGS. 13 to 16 together with FIG. 1 and FIG. 2 described above. In FIGS. 13 to 16, the same components as those in FIGS. 1 and 2 are denoted by the same reference numerals, and thus a repeated description thereof will be omitted.

Each of FIGS. 13 to 16 illustrates a schematic cross-sectional view of a deposition mask according to an embodiment.

Figure 13:
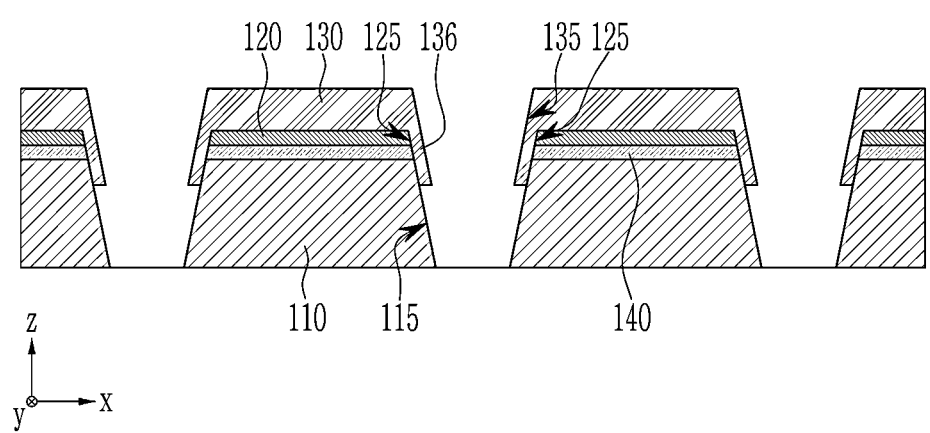

Referring to FIG. 13, the deposition mask 100 according to the embodiment described above with reference to FIG. 1, at least one interlayer 140 positioned or disposed on the resin film 110 may be further included.

The interlayer 140 may be positioned or disposed between the resin film 110 and the non-resin layer 120, and may be formed of (or include) a single layer or multiple layers.

The interlayer 140 may include an inorganic material such as a silicon oxide ($SiO_x$) or a silicon nitride ($SiN_x$), but the disclosure is not limited thereto.

The interlayer 140 may substantially overlap the top surface of the resin film 110, and may have a side surface aligning with the upper side surface of the hole 115 of the resin film 110.

The interlayer 140 may increase an adhesion between the resin film 110 and the non-resin layer 120.

Figure 14:
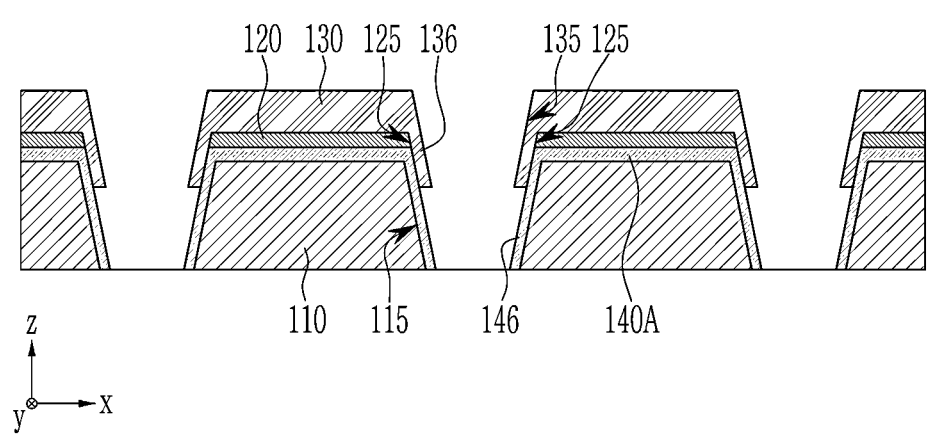

Referring to FIG. 14, an interlayer 140A according to an embodiment may be similar to the interlayer 140 described above with reference to FIG. 13, a lateral portion 146 extending or connecting to the interlayer 140A may be included in addition to the interlayer 140A.

The lateral portion 146 may cover the side surface of the hole 115 of the resin film 110.

Figure 15:
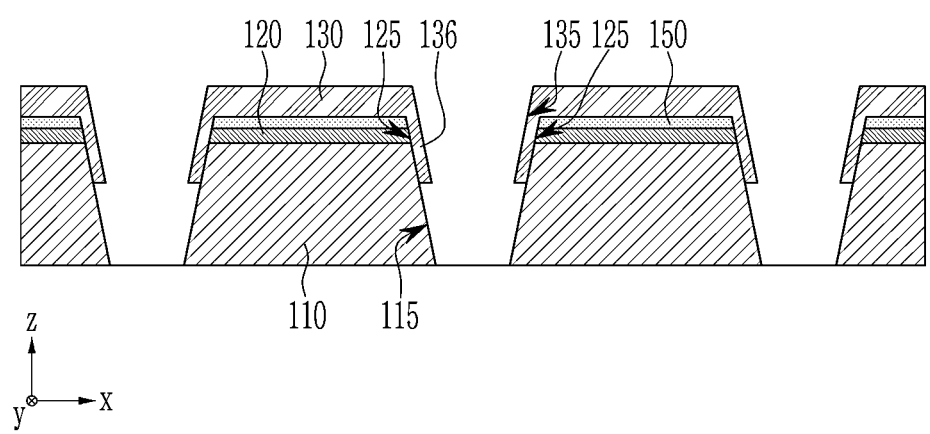

Referring to FIG. 15, the deposition mask 100 according to the embodiment described above with reference to FIG. 1, at least one interlayer 150 positioned or disposed on the non-resin layer 120 may be included.

The interlayer 150 may be positioned or disposed between the non-resin layer 120 and the protective layer 130, and may be formed of (or include) a single layer or multiple layers.

The interlayer 150 may include an inorganic material such as a silicon oxide ($SiO_x$) or a silicon nitride ($SiN_x$), but the disclosure is not limited thereto.

The interlayer 150 may substantially overlap the top surface of the non-resin 120, and may include a side surface aligning with the upper side surface of the hole 125 of the non-resin 120.

The interlayer 150 may increase an adhesion between the non-resin 120 and the protective layer 130.

Figure 16:
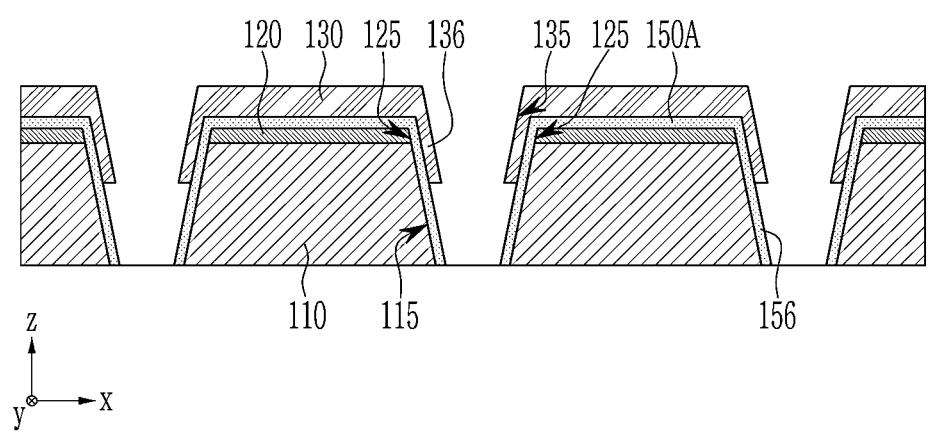

Referring to FIG. 16, an interlayer 150A according to an embodiment may be similar to the interlayer 150 described above with reference to FIG. 15, a lateral portion 156 extending or connecting to the interlayer 150A may be included in addition to the interlayer 150A.

The lateral portion 156 may cover the side surface of the hole 125 of the non-resin layer 120, and may also cover the side surface of the hole 115 of the resin film 110.

A description of a deposition mask according to an embodiment follows below with reference to FIGS. 17 to 20 together with FIG. 3 and FIG. 4 described above. In FIGS. 17 to 20, the same components as those in FIG. 3 and FIG. 4 are denoted by the same reference numerals, and thus a repeated description thereof will be omitted.

Each of FIGS. 17 to 20 illustrates a schematic cross-sectional view of a deposition mask according to an embodiment.

Figure 17:
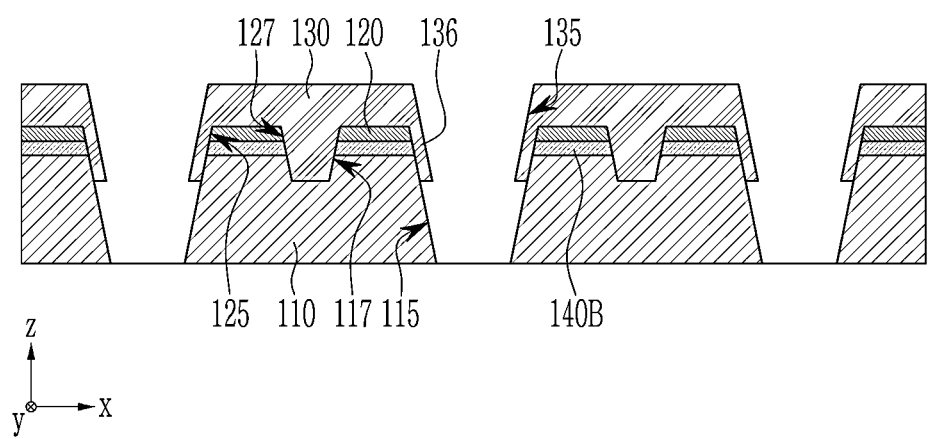

Referring to FIG. 17, the deposition mask 100A according to the embodiment as described above with reference to FIG. 3, at least one interlayer 140B positioned or disposed on the resin film 110 may be further included.

The interlayer 140B may be positioned or disposed between the resin film 110 and the non-resin layer 120, and may be formed of (or include) a single layer or multiple layers.

The interlayer 140B may include an inorganic material such as a silicon oxide ($SiO_x$) or a silicon nitride ($SiN_x$), but the disclosure is not limited thereto.

The intermediate layer 140B may include a top surface that substantially overlapping the top surface of the resin film 110, a side surface aligning with the upper side surface of the hole 115 of the resin film 110, and another side surface aligning with the side surface of the recess portion 117 of the resin film 110.

The interlayer 140B may increase an adhesion between the resin film 110 and the non-resin layer 120.

Figure 18:
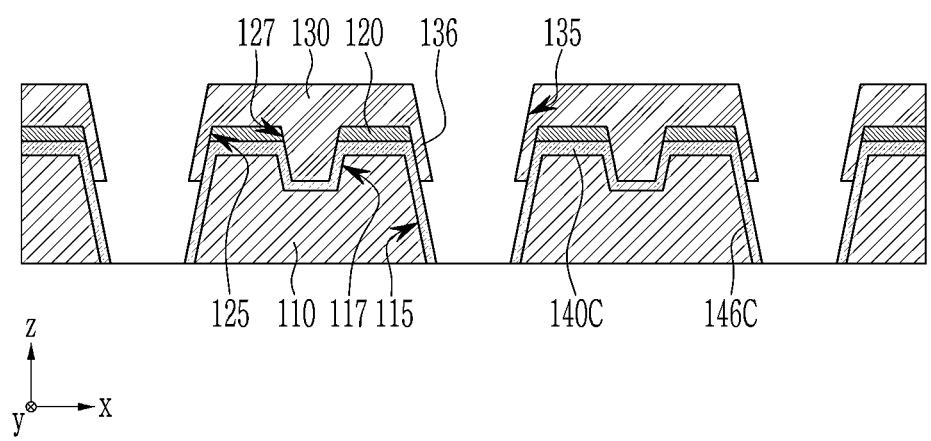

Referring to FIG. 18, an interlayer 140C according to an embodiment may be similar to the interlayer 140B described above with reference to FIG. 17, a lateral portion 146C extending or connecting to the interlayer 140C, and portions positioned on the top surface and the side surface of the recess portion 117 of the resin film 110 may be included in addition to the interlayer 140C.

The interlayer 140C may entirely cover the top and side surfaces of the resin film 110.

Figure 19:
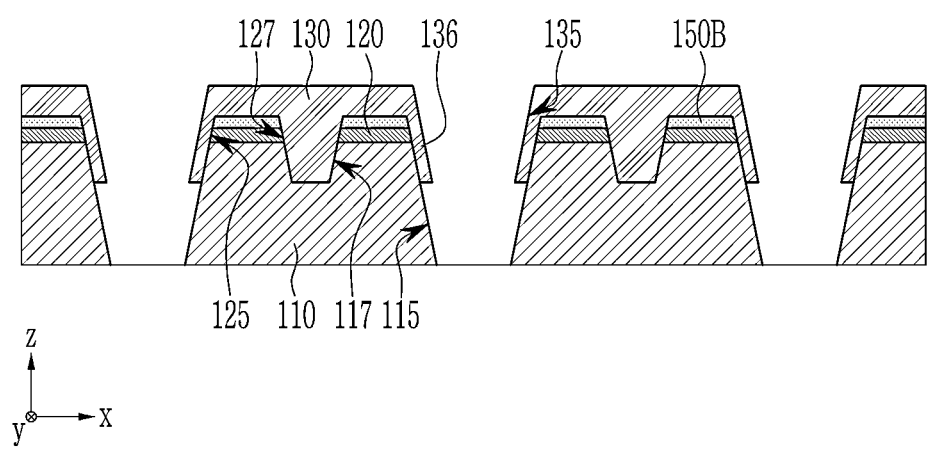

Referring to FIG. 19, the deposition mask 100A according to the embodiment as described above with reference to FIG. 3, at least one interlayer 150B positioned or disposed on the non-resin layer 120 may be included.

The interlayer 150B may be positioned or disposed between the non-resin layer 120 and the protective layer 130, and may be formed of (or include) a single layer or multiple layers.

The interlayer 150B may include an inorganic material such as a silicon oxide ($SiO_x$) or a silicon nitride ($SiN_x$), but the disclosure is not limited thereto.

The interlayer 150B may include a top surface substantially overlapping the top surface of the non-resin 120, a side surface aligning with the upper side surface of the hole 125 of the non-resin 120, and another side surface aligning with the side surface of the recess portion 117 of the resin film 110.

The interlayer 150B may increase an adhesion between the non-resin 120 and the protective layer 130.

Figure 20:
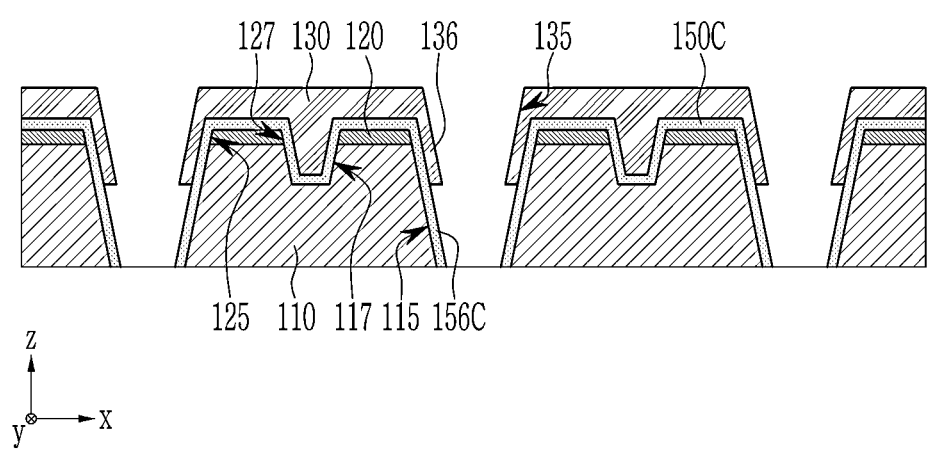

Referring to FIG. 20, an interlayer 150C according to an embodiment may be similar to the interlayer 140B as described above with reference to FIG. 19, a lateral portion 156C extending or extending to the interlayer 150B, and portions positioned or disposed on the top surface and the side surface of the recess portion 117 of the resin film 110 and the side surface of the non-resin layer 120 that aligns with the side surface of the recess portion 117 may be included in addition to the interlayer 150B.

The lateral portion 156C may cover the side surface of the hole 125 of the non-resin layer 120, and may also cover the side surface of the hole 115 of the resin film 110.

The interlayer 150B may entirely cover the side surface of the resin film 110, the top surface of the recess portion 117, and the top and side surfaces of the non-resin layer 120.

While this invention has been described in connection with what is considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A deposition mask comprising:
a resin film including first holes;
a non-resin layer disposed on the resin film and including second holes corresponding to the first holes, each of the second holes of the non-resin layer including a side surface aligning with an upper side surface of a respective first hole of the first holes of the resin film such that each side surface of the non-resin layer and respective side surface of the resin film together form a single plane; and
a protective layer disposed on the non-resin layer and including third holes corresponding to the first holes, wherein
the protective layer includes:
a first portion disposed on a top surface of the non-resin layer; and
a second portion covering a side surface of the second holes of the non-resin layer.

2. The deposition mask of claim 1, wherein the protective layer includes at least one of a fluorine-based organic material, a fluorine-based inorganic material, and a fluorine-based metal material.

3. The deposition mask of claim 2, wherein the non-resin layer includes at least one of a magnetic material or a conductive material.

4. The deposition mask of claim 3, wherein the resin film includes a polyimide (PI).

5. The deposition mask of claim 1, wherein the third holes of the protective layer are defined by an outer side surface of the second portion of the protective layer.

6. The deposition mask of claim 5, wherein the second portion of the protective layer covers a side surface of the first holes of the resin film.

7. The deposition mask of claim 1, wherein the resin film includes a recess portion located in an upper portion of the resin film.

8. The deposition mask of claim 7, wherein the non-resin layer includes a fourth hole corresponding to the recess portion.

9. The deposition mask of claim 8, wherein the protective layer covers a side surface of the recess portion.

10. The deposition mask of claim 7, further comprising:
an interlayer disposed on the resin film.

11. The deposition mask of claim 10, wherein the interlayer includes a portion disposed between the resin film and the non-resin layer.

12. The deposition mask of claim 11, wherein the interlayer includes a portion covering a side surface of the first holes of the resin film.

13. The deposition mask of claim 11, wherein the interlayer includes an inorganic material.

14. The deposition mask of claim 1, further comprising: an interlayer disposed on the resin film.

15. The deposition mask of claim 14, wherein the interlayer includes a portion disposed between the resin film and the non-resin layer or between the non-resin layer and the protective layer.

16. The deposition mask of claim 15, wherein the interlayer includes a portion covering a side surface of the first holes of the resin film.

17. The deposition mask of claim 15, wherein the interlayer includes an inorganic material.

18. The deposition mask of claim 9, wherein the protective layer covers a side surface of the fourth hole of the non-resin layer.

19. The deposition mask of claim 10, wherein the interlayer includes a portion disposed between the non-resin layer and the protective layer.

20. The deposition mask of claim 1, wherein the protective layer includes a third portion covering only a portion of a side surface of the first holes of the resin film.

* * * * *